United States Patent [19]

Scopaz

[11] 4,045,662
[45] Aug. 30, 1977

[54] SELF TESTING MONITORING APPARATUS FOR MULTIPLEXED DIGITAL INPUT SIGNALS

[75] Inventor: Joseph T. Scopaz, North Bergen, N.J.

[73] Assignee: The Bendix Corporation, Teterboro, N.J.

[21] Appl. No.: 671,203

[22] Filed: Mar. 29, 1976

[51] Int. Cl.² ............................................. G06F 11/00
[52] U.S. Cl. .............................. 235/153 A; 307/269; 328/110; 340/146.1 AB
[58] Field of Search ............. 340/146.1 AB, 146.1 R; 235/153 R, 153 A; 307/208, 232, 242, 269; 328/72, 110, 150; 244/77 M

[56] References Cited

U.S. PATENT DOCUMENTS

| | | | |
|---|---|---|---|
| 3,673,429 | 7/1972 | Perry et al. | 328/110 |
| 3,721,833 | 3/1973 | Kramer | 307/232 |
| 3,751,679 | 8/1973 | Rotier | 307/269 |
| 3,970,995 | 7/1976 | Baudouin et al. | 307/269 |

*Primary Examiner*—Charles E. Atkinson
*Attorney, Agent, or Firm*—Anthony F. Cuoco

[57] ABSTRACT

Apparatus for monitoring the validity of multiplexed digital input address and data signals includes self monitoring characteristics whereby an internal failure will cause an invalid output signal to be provided by the monitoring apparatus.

8 Claims, 3 Drawing Figures

SELF TESTING MONITORING APPARATUS FOR MULTIPLEXED DIGITAL INPUT SIGNALS

BACKGROUND OF THE INVENTION

1. Field of the Invention

This invention relates generally to apparatus for monitoring the validity of multiplexed digital input signals. More particularly, this invention relates to apparatus of the type described which has self testing characteristics.

2. Description of the Prior Art

Control systems such as may be used for controlling aircraft engines may include manually operated controllers which provide digital signals corresponding to parameters being controlled. Monitoring systems of this type require that the digital signals be multiplexed to reduce the redundancy of circuit components. Further, it is important that the validity of the signals be monitored and an indication be provided when the signals are invalid. Finally, the monitoring apparatus must be self testing to minimize system integrity.

SUMMARY OF THE INVENTION

This invention contemplates apparatus responsive to a plurality of multiplexed digital input address signals and corresponding data signals for monitoring the validity of the signals, and which monitor provides output signals indicative of the validity of the input signals. The signal validity monitor includes logic circuity responsive to the input signals and arranged so that a circuit failure will provide an invalid output signal thereby imparting self testing characteristics to the apparatus.

One object of this invention is to provide a monitor for determining the validity of multiplexed digital input address and data signals.

Another object of this invention is to provide a monitor of the type described which has self testing characteristics.

Another object of this invention is to provide a monitor of the type described which includes logic circuitry for monitoring digital input address and data signals, and which monitor provides an invalid output signal upon an internal failure.

The foregoing and other objects and advantages of the invention will appear more fully hereinafter from a consideration of the detailed description which follows, taken together with the accompanying drawings wherein one embodiment of the invention is illustrated by way of example. It is to be expressly understood, however that the drawings are for illustration purposes only and are not to be construed as defining the limits of the invention.

DESCRIPTION OF THE INVENTION

Figure 1:
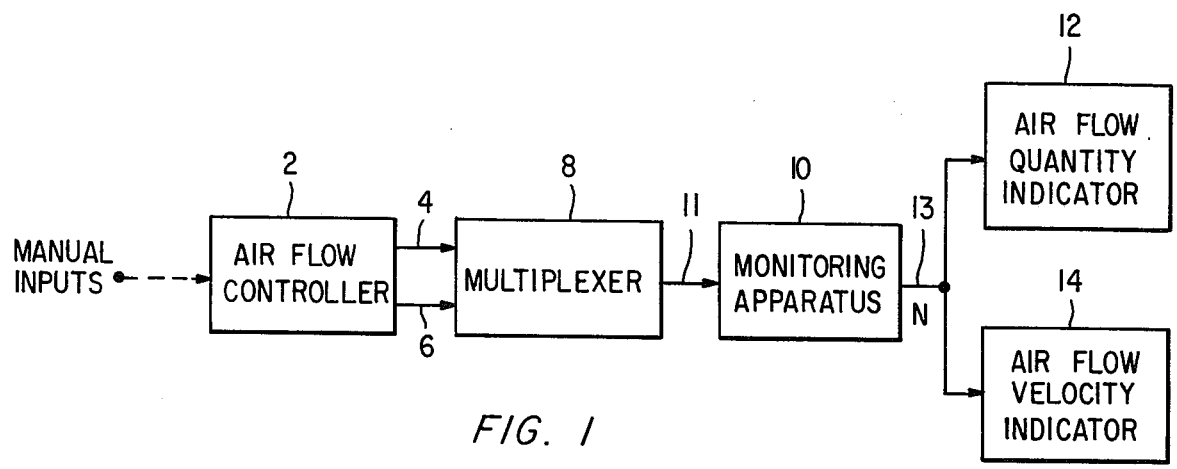
FIG. 1 is a block diagram showing generally the type of system with which the monitoring apparatus of the invention may be used.

With reference first to FIG. 1, the invention will be described as part of a system for controlling the flow of air to an aircraft engine. It is to be understood, however, that the description is for illustrative purposes only and the principles of the invention may be applied to any type of control system as well.

With the above in mind, an aircraft engine air flow controller 2 is manually operated such as by turning a knob or the like, whereby the pilot of an aircraft provides inputs which may, in the illustrative example, correspond to a predetermined quantity of air flow and a predetermined air flow velocity, and which inputs may provide a desired aircraft speed. Air flow controller 2 is of the type which responds to the manual inputs and internally converts said inputs to a plurality of digital address signals, and whereby the controller provides at output conductors 4 and 6 a plurality of data signals in response to the address signals. The digital data signals are shown as two in number for purposes of illustration.

Figure 2:
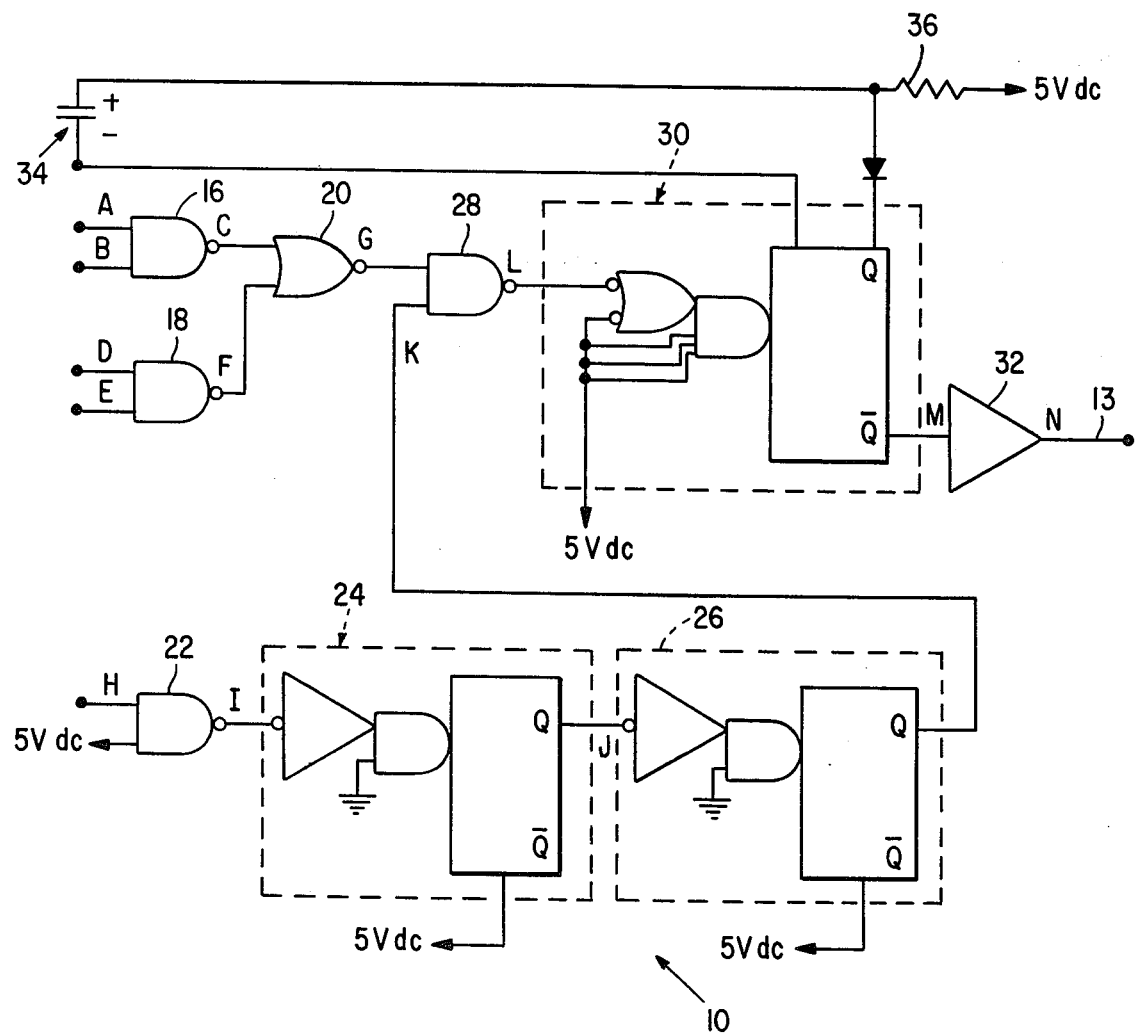
FIG. 2 is a schematic diagram showing the structural arrangement of the monitoring apparatus shown generally in FIG. 1.

The data signals are multiplexed through a conventional multiplexer 8 and applied to monitoring apparatus 10 constructed according to the invention, and which apparatus 10 is shown in substantial detail in FIG. 2. Apparatus 10 monitors the validity of the signals from multiplexer 8 provided at an output conductor 11 and provides signals at an output conductor 13 which, in the illustrative example, may correspond to air flow quantity and air flow velocity. If the signals provided by monitor 10 are invalid, indicators 12 and 14, respectively, will provide an indication such as bringing a flag into view, providing alarm or the like, whereby the pilot of the craft may be appraised of the situation at hand and thereupon take remedial action.

With further reference to FIG. 1, it is to be understood that the invention being described relates only to monitoring apparatus 10, with controller 2, multiplexer 8, air flow quantity indicator 12 and air flow velocity indicator 14 being components which are well known in the art and therefore will not be further described herein.

With reference now to FIG. 2, monitoring apparatus 10 includes a pair of inverting AND gates 16 and 18 having outputs connected to an inverting OR gate 20. An inverting AND gate 22 provides an output which is connected to a one shot multivibrator 24 powered by 5 volt d.c. source, and which multivibrator 24 may be of the type manufactured by the Fairchild Corporation and carrying their trade designation AM 2602. The output of multivibrator 24 is connected to a like multivibrator 26 which provides an output which is applied to an inverting AND gate 28 as is the output from gate 20. Gate 28 provides an output which is applied to a one shot multivibrator 30, and which multivibrator 30 may be of the type manufactured by the Fairchild Corporation and carrying their trade designation AM 2600. Multivibrator 30 provides an output which is applied to an inverting amplifier 32. The output of amplifier 32 is the output of monitoring apparatus 10 as provided at output conductor 13 (FIG. 1).

Timing characteristics for monitor 10 are provided by an RC circuit including a capacitor 34 connected across multivibrator 30 and a 5 volt d.c. source, and a resistor 36 connected in series with the capacitor. Another output of multivibrator 30 is connected to a steering diode 38, and which steering diode is connected intermediate capacitor 34 and resistor 36.

OPERATION OF THE INVENTION

The operation of the invention is best illustrated with reference to the timing diagram of FIG. 3 in conjunction with the aforenoted FIG. 2. Thus, in response to the manual inputs from air flow controller 2 (FIG. 1), 9 bit first and second digital input address signals are generated, and which input address signals in turn generate 17 bit first and second data signals which are multiplexed through multiplexer 8 (FIG. 1) to signal validity monitor 10.

For purposes of illustration, each of the bits in the address and data signals is 1 microsecond in duration with the signals being repeated every 33.3 milliseconds. Although a feature of the system shown in FIG. 1 is its multiplexing characteristic, the processing of a single input address signal and its associate data signal through monitoring apparatus 10 will be described for purposes of illustration.

Figure 3:
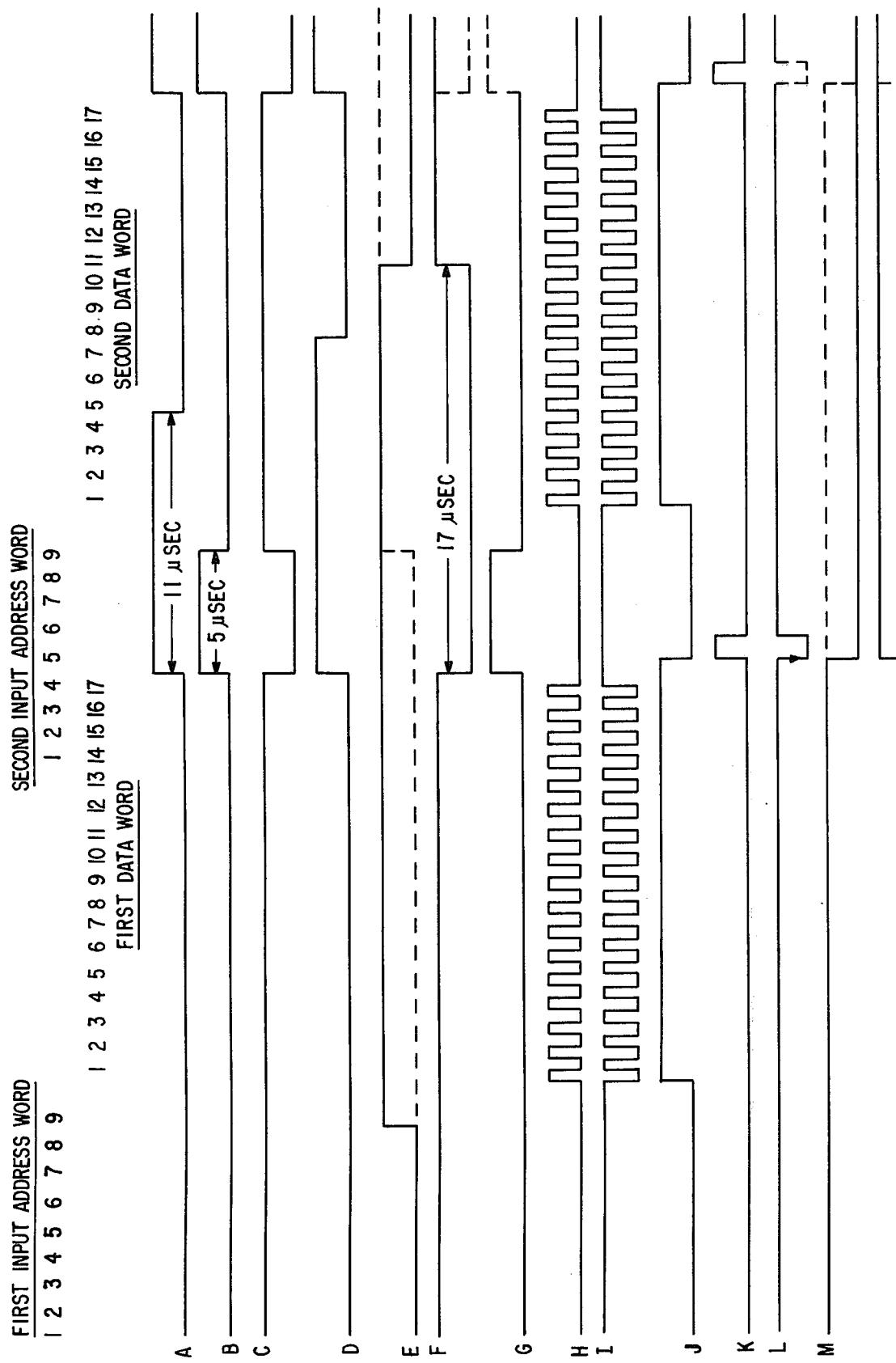
FIG. 3 is a timing diagram showing the timing relationship and the waveforms of various signals provided in accordance with the invention shown in FIG. 2.

With particular reference now to FIGS. 2 and 3, the inputs to gate 16 shown in FIG. 2 are designated as signals A and B shown in FIG. 3. Signal A is a data parity signal and indicates valid parity for 11 microseconds after bit 17 of the first data signal. Gate 16 ANDS this signal with signal B which indicates a valid address transmission for 5 microseconds after bit 17 of the first data word to provide signal C at its output.

The inputs to gate 18 shown in FIG. 2 are signals D and E shown in FIG. 3. Gate 18 ANDS signals D and E to provide signal F which is valid for 17 microseconds after bit 17 of the first data word. Signal D corresponds to bit 8 of the first data signal while signal E is the first address word.

Signal C from gate 16 and signal F from gate 18 are OR'D by gate 20 to provide signal G shown in FIG. 3.

Signal H is a data clock signal and is applied to gate 22 as is a signal from a suitable 5 volt d.c. source. Gate 22 ANDS the signals to provide signal I. Signal I is applied through one shot multivibrator 24 which provides signal J. Signal J is applied through multivibrator 26, which is a pulse producing multivibrator, and which provides signal K.

Signal G from OR gate 20 and signal K from multivibrator 26 are applied to gate 28 which ANDS the signals to provide signal L. Signal L is applied to multivibrator 30. The falling edge of signal L provides signal M which, upon inversion by inverting amplifier 32, provides signal N which is the output of signal validity monitor 10 as shown in FIGS. 1 and 2.

It will now be understood from the aforenoted description of the invention with reference to the figures, that if signals A, B, C, D, E, H or K are not provided in accordance with the timing diagram of FIG. 3, signal N will be at a logic low level which is indicative of invalid input signals or a malfunction of monitor 10, with an indication thus being provided by indicators 12 or 14 described with reference to FIG. 1.

It will be further understood that while the invention has been described with reference to a single input address signal and a corresponding data signal, the multiplexing feature of the system as shown in FIG. 1 permits a plurality of address signals and corresponding data signals to be processed and monitored without redundant equipment.

Thus, a device has been disclosed which monitors the validity of digital input address and corresponding data signals, and which, further, is internally self monitoring. A device of the type described is of extreme importance in control systems or the like which respond to manual inputs, and wherein it is important for the operator of the system to know when the manual inputs are providing invalid data or the monitor itself has developed a fault.

Although but a single embodiment of the invention has been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. A monitor for monitoring a digital address signal and corresponding data signal, comprising:
   means for providing a data parity signal;
   means for providing a signal indicating a valid address transmission;
   means for providing a signal corresponding to a predetermined bit of the data signal;
   means for providing the address signal;
   means for providing a data clock signal;
   means for combining the data parity, valid address transmission, predetermined data bit and address signals and for providing a first signal;
   means for providing a signal at a predetermined constant level;
   means responsive to the data clock signal and the signal at the predetermined constant level for providing a second signal; and
   means responsive to the first and second signals for providing a monitor output signal.

2. A monitor as described by claim 1, wherein the means for combining the data parity, valid address transmission, predetermined data bit and address signals, and for providing a first signal includes:
   first means for combining the data parity and valid address transmission signals;
   second means for combining the predetermined data bit and address signals; and
   third means for combining the combined signals from the first and second means to provide the first signal.

3. A monitor as described by claim 2, wherein the means responsive to the data clock signals and a signal at a predetermined constant level for providing a second signal includes:
   fourth means for combining the data clock signal and the predetermined constant level signal; and
   fifth means responsive to the combined signal from the fourth means for providing the second signal.

4. A monitor as described by claim 2, wherein the means responsive to the first and second signals for providing a monitor output signal includes:
   sixth means for combining the first and second signals; and
   seventh means responsive to the sixth signal for providing the monitor output signal.

5. A monitor as described by claim 2, wherein:
   the first means is an inverting AND gate;
   the second means is an inverting AND gate; and
   the third means is an inverting OR gate.

6. A monitor as described by claim 3, wherein:
   the fourth means is an inverting AND gate; and
   the fifth means includes a first one-shot multivibrator and a second one-shot multivibrator connected to the first multivibrator.

7. A monitor as described by claim 4, wherein:

the sixth means is an inverting AND gate; and the seventh means includes a one-shot multivibrator responsive to the sixth signal from the inverting AND gate and an inverting amplifier connected to the multivibrator and responsive to the output therefrom for providing the monitor output signal.

8. A monitor as described by claim 1, wherein:

the data parity, valid address transmission, predetermined data bit, address, data clock and second signals are normally in a predetermined time relationship relative to each other; and the monitor output signal is at a predetermined logic level indicative of an invalidity when any of the signals are in a time relationship other than the predetermined time relationship.

* * * * *